(12) United States Patent
Gunnarsson

(10) Patent No.: US 12,087,990 B2
(45) Date of Patent: Sep. 10, 2024

(54) WAVEGUIDE LAUNCH SYSTEM FOR COUPLING TO A WAVEGUIDE CHANNEL THROUGH A PROBE MEMBER ON A FIRST LAMINA AND AN INTEGRATED BACK-SHORT ON A SECOND LAMINA

(71) Applicant: SAAB AB, Linköping (SE)

(72) Inventor: Sten Gunnarsson, Järfälla (SE)

(73) Assignee: SAAB AB, Linköping (SE)

( * ) Notice: Subject to any disclaimer, the term of this patent is extended or adjusted under 35 U.S.C. 154(b) by 947 days.

(21) Appl. No.: 17/046,840

(22) PCT Filed: Apr. 13, 2018

(86) PCT No.: PCT/SE2018/050379
§ 371 (c)(1),
(2) Date: Oct. 12, 2020

(87) PCT Pub. No.: WO2019/199212
PCT Pub. Date: Oct. 17, 2019

(65) Prior Publication Data
US 2021/0151849 A1 May 20, 2021

(51) Int. Cl.
*H01P 5/107* (2006.01)
*H05K 1/02* (2006.01)
*H05K 1/14* (2006.01)

(52) U.S. Cl.
CPC .......... *H01P 5/107* (2013.01); *H05K 1/0225* (2013.01); *H05K 1/0246* (2013.01); *H05K 1/144* (2013.01);
(Continued)

(58) Field of Classification Search
CPC ...................................... H01P 5/107
(Continued)

(56) References Cited

U.S. PATENT DOCUMENTS 6,958,662 B1 * 10/2005 Salmela et al. ......... H01P 5/107
333/33
8,536,954 B2 * 9/2013 Leiba et al. ........... H05K 1/025
333/33
(Continued)

FOREIGN PATENT DOCUMENTS

EP   1396902 A1   3/2004
EP   2267832 A1   12/2010
(Continued)

OTHER PUBLICATIONS

Extended European Search Report mailed Oct. 28, 2021 for European Patent Application No. 18914021.3, 9 pages.
(Continued)

*Primary Examiner* — Benny T Lee
(74) *Attorney, Agent, or Firm* — Sage Patent Group

(57) ABSTRACT

A waveguide launch system configured for translating radio frequency signal waves is provided. The system comprises a first printed circuit board lamina comprising an electrically conductive ground member and configured for attachment of a separate waveguide element, having a first cross-section area, thereto. A second printed circuit board lamina comprising an electrically conductive backshort cover configured to reflect the RF signal waves is bonded to a first printed circuit board lamina. An electrically conductive barrier arrangement extends through the second printed circuit board lamina. The electrically conductive barrier arrangement and the electrically conductive backshort cover form an integrated electrically conductive backshort volume of an integrated backshort having a second cross-section area. The second cross-section area is smaller than the first cross-section area.

9 Claims, 3 Drawing Sheets

(52) U.S. Cl.
CPC .  *H05K 2201/042* (2013.01); *H05K 2201/096* (2013.01); *H05K 2201/09609* (2013.01); *H05K 2201/10098* (2013.01)

(58) Field of Classification Search
USPC .......................................................... 333/26
See application file for complete search history.

(56) References Cited

U.S. PATENT DOCUMENTS

| | | |
|---|---|---|
| 2006/0091971 A1 | 5/2006 | Tahara et al. |
| 2007/0109178 A1 | 5/2007 | Schultheiss |
| 2007/0182505 A1 | 8/2007 | Fujita et al. |
| 2007/0262828 A1 | 11/2007 | Fujita |
| 2011/0057741 A1 | 3/2011 | Dayan et al. |
| 2012/0256707 A1 | 10/2012 | Leiba et al. |
| 2013/0278349 A1 | 10/2013 | Dayan et al. |

FOREIGN PATENT DOCUMENTS

| | | |
|---|---|---|
| JP | 2006279519 A | 10/2006 |
| JP | 2007013450 A | 1/2018 |

OTHER PUBLICATIONS

Liu, Yu et al.; "A Novel Compact Microstrip-to-Waveguide Transition Structure for Integration with Multilayered Circuits"; 39th International Conference on Infrared, Millimeter, and Terrahertz Waves, Sep. 14, 2014, 2 pages.

Coonrod, John; "Understanding the Variables of Dielectric Constant for PCB Materials used at Microwave Frequencies"; Proceedings of the 41st European Microwave Conference, Oct. 10-13, 2011, Manchester, UK, 7 pages.

International Search Report and Written Opinion in corresponding International Application No. PCT/SE2018/050379 mailed Dec. 17, 2018 (12 pages).

International Preliminary Report on Patentability in corresponding International Application No. PCT/SE2018/050379 mailed Aug. 5, 2020 (8 pages).

Sakakibara et al.; "Broadband and Planar Microstrip-to-Waveguide Transitions in Millimeter-Wave Band"; 2008 International Conference on Microwave and Millimeter Wave Technology; Apr. 21-24, 2008; Nanjing, China (4 pages).

* cited by examiner

WAVEGUIDE LAUNCH SYSTEM FOR COUPLING TO A WAVEGUIDE CHANNEL THROUGH A PROBE MEMBER ON A FIRST LAMINA AND AN INTEGRATED BACK-SHORT ON A SECOND LAMINA

CROSS-REFERENCE TO RELATED APPLICATIONS

This application is a U.S. National Stage application of PCT/SE2018/050379, filed Apr. 13, 2018 and published on Oct. 17, 1029 as WO 2019/199212, all of which is hereby incorporated by reference in its entirety.

TECHNICAL FIELD

The present invention relates to a waveguide launch system configured for translating radio frequency signal waves.

The present invention concerns the industry of manufacturing waveguide launch systems and applications thereof.

The present invention may also concern the aerial vehicle industry or any other industry building high frequency equipment.

BACKGROUND

Current technology describes waveguide launch systems that comprise backshort members that are integrated into structural mechanics including environmental protection of sensitive bare electrical chips/MMICs and similar integrated circuit units.

RF systems operating at high frequencies may use bare die structures having such integrated circuit units soldered or glued to a PCB (printed circuit board) and being connected via a bond wire or other electrically conductive wire to one end of an adjacent microstrip transmission line or other electrical transmission line signal member. The most common approach to couple the integrated circuit unit to a separate waveguide is to extend the electrical transmission line signal member through an electrically small hole into the backshort (where a waveguide mode is excited) and transmit the radio frequency signal waves downwards through the PCB and further to the connected separate waveguide.

The requirements for the manufacture and assembly on the PCB of specific prior art mechanical backshorts results in a major cost due to small alignment tolerances when the operating frequency is high. Mechanical backshorts consist of two-parts that are assembled to constitute one piece. One part comprises the probe member and the other part comprises the backshort and it is extremely important that the parts are in proper alignment against each other.

A mechanical backshort typically has an inner height of slightly less than a quarter wavelength. The inner dimensions and alignment of the mechanical backshort thus need to be very accurate in order not to affect the performance of the waveguide structure system in a negative way.

Furthermore, the backshort is often integrated into large mechanical structures that includes environmental protection of the sensitive bare electrical chips determining the overall tolerances needed when assembling on the PCB, which further increase the overall cost.

A known way to circumvent the need of a stand-alone mechanical backshort is to connect the microstrip transmission line applied onto a PCB lamina and extend the mechanical backshort directly into an open single separate waveguide and a standard patch antenna.

For example, at high mm-wave RF frequencies using III-V MMIC units, a common electrical chip thickness is 50 µm. A commonly used PCB substrate lamina at high frequencies is a PTFE-based substrate with a dielectric constant of approximately 3. This means that a 50 µm PTFE-based PCB will be 1/35 of a wavelength thick at 100 GHz. It is not possible to design a wideband patch antenna with such a thin dielectric.

It is of great importance that the PCB lamina thickness be kept at the same order as the thickness of the electrical chip in order to avoid excessively long bond wires or conductive wires, which otherwise will deteriorate the RF performance of the bond wire transition.

Another drawback is that an open air channel often must extend from the open single waveguide through a small hole and into the cavity of the integrated circuit unit. Thus, the integrated circuit unit will be exposed to humidity. For hermetical purpose, a dielectric lid may be arranged inside the waveguide which will have a negative impact on the RF performance.

US Patent Publication Number 20130278349 A1 shows a bare-die integrated circuit electrically connected to a transmission line reaching a printed probe inside a waveguide launch. Via holes of the PCB are filled with electrically conductive material providing an electrically conductive barrier arrangement, which together with an electrically conductive backshort cover forms an integrated electrically conductive backshort volume having a cross-section area that corresponds with an outer open waveguide structure of a separate waveguide channel.

SUMMARY OF THE INVENTION

An object of the present disclosure is to provide a waveguide launch system that can be used at mm-wave frequencies, and in which the waveguide launch system comprises a waveguide launch that is robust and which can be manufactured cost-effectively.

An object is to provide a waveguide launch system with hermeticity and environmental protection of the integrated circuit unit.

An object is to provide a waveguide launch system that is suitable for wideband RF performance.

At least one of these objects can be obtained by a waveguide launch system configured for translating radio frequency signal waves, wherein the waveguide launch system comprises; a separate waveguide channel of a separate waveguide element having a first cross-section area; a first printed circuit board lamina comprising an electrically conductive ground member and configured for attachment of the separate waveguide element thereto; a second printed circuit board lamina comprising an electrically conductive backshort cover configured to reflect the radio frequency signal waves; an electrically conductive barrier arrangement extending perpendicular to the plane of the second printed circuit board lamina and extending through the second printed circuit board lamina, wherein the electrically conductive barrier arrangement and the electrically conductive backshort cover form an integrated electrically conductive backshort volume of an integrated backshort having a second cross-section area, which is smaller than the first cross-section area; a probe member arranged within an interface defined between the first printed circuit board lamina and the second printed circuit board lamina; an electrical transmission line signal member arranged within the interface and coupled between the probe member and an integrated circuit unit; wherein the thickness of the second printed circuit board lamina is determined by the material property of the second printed circuit board lamina in regard to the scaling of the thickness when taking into account the wavelength of the radio frequency signal waves.

Advantageously, the proposed waveguide launch system can be manufactured by low-cost PCB (Printed Circuit Board) technology and produced cost-effectively.

Further, the proposed waveguide launch system eliminates the need of labour-intensive manufacture of external mechanical backshorts, while maintaining wideband RF performance.

The proposed waveguide launch system is compatible with thin RF circuits and at the same time hermeticity is provided by means of the integrated backshort that is integrated in the second printed circuit board lamina.

The proposed waveguide launch system is suitable for mm-wave frequencies and at the same time as the waveguide launch system is compatible with standard low cost PCB technologies.

The proposed waveguide launch system is robust, wherein an optionally arranged outer electrically conductive barrier arrangement according to one example provides the waveguide launch to have additional structural strength and robustness.

The proposed waveguide launch system can be manufactured cost-effectively and extremely in small dimension for generating mm-wave frequencies in a robust way.

Alternatively, the second cross-section area of the second printed circuit board (PCB) is down-scaled versus the first cross-section area of the first printed circuit board when taking into account a material property of the second printed circuit board lamina, the material property being permittivity of the PCB material used in the second printed circuit board lamina 9.

Alternatively, the thickness of the second printed circuit board lamina corresponds with a length of at least a quarter of a wavelength for the radio frequency signal waves.

Alternatively, the thickness of the second printed circuit board lamina forms the height of the integrated backshort.

Alternatively, the electrically conductive barrier arrangement comprises through holes machined through the second printed circuit board lamina, and in which the through holes are filled with electrically conductive material.

Alternatively, the electrically conductive material of the electrically conductive barrier arrangement comprises copper.

Accordingly, a cost-effective manufacture of the waveguide launch system is achieved.

Accordingly, a high performance of the waveguide launch system is achieved.

Alternatively, an outer electrically conductive barrier arrangement at least partially surrounds the electrically conductive barrier arrangement and extends perpendicular to the plane of and through the first and second printed circuit board lamina.

Alternatively, the outer electrically conductive barrier arrangement is electrically coupled between the electrically conductive ground member and the electrically conductive backshort cover for electrical communication.

Alternatively, the outer electrically conductive barrier arrangement is electrically coupled to an electrically conductive ground member plane of the interface.

Alternatively, the electrically conductive barrier arrangement is electrically coupled between the electrically conductive backshort cover and the electrically conductive ground member plane.

Alternatively, the electrically conductive barrier arrangement is electrically grounded by coupling a first end of the electrically conductive barrier arrangement to the electrically conductive backshort cover, which in turn is coupled to the electrically conductive ground member via the outer electrically conductive barrier arrangement, and by coupling a second end of the electrically conductive barrier arrangement to the electrically conductive ground member plane, which in turn is coupled to the electrically conductive ground member via the outer electrically conductive barrier arrangement.

Alternatively, the perimeter of the first cross-section area is rectangular shaped.

Alternatively, an electrically conductive wire is coupled between the integrated circuit unit and the electrical transmission line signal member arranged to the first printed circuit board lamina, the thickness of the electrically conductive wire corresponds with the height of the the integrated circuit unit.

Prior art high frequency waveguide systems require thin integrated circuit units (electrical chips) for providing high frequency signals. By means of using the same thickness for the first printed circuit board lamina as that of the integrated circuit unit, there is achieved that a lower face of the integrated circuit unit and a lower surface of the first printed circuit board lamina that can be attached to a common electrically conductive ground member (ground plane), wherein an upper face of the integrated circuit unit and an upper surface of the first printed circuit board lamina will have the same level.

Alternatively, a first end of the electrically conductive wire is coupled to the upper face of the integrated circuit unit and a second end of the electrically conductive wire is coupled to the electrical transmission line signal member of the upper surface of the first printed circuit board lamina.

Accordingly it is possible to arrange and couple an optimal short conductive wire between the integrated circuit unit and the electrical transmission line signal member, wherein the first printed circuit board lamina serves as a dielectric spacing between the electrically conductive ground member and the electrical transmission line signal member.

Alternatively, the probe member is configured to generate the radio frequency signal waves toward the electrically conductive backshort cover.

Alternatively, the electrically conductive integrated backshort enclosure and the separate waveguide element are configured to guide the radio frequency signal waves toward an open end of the separate waveguide element.

At least one of the objects can be obtained by a wideband probe fed patch antenna apparatus configured for mm-wave frequencies making use of the above-mentioned waveguide launch system.

At least one of the objects can be obtained by a commercial aircraft comprising the above-mentioned wideband probe fed patch antenna apparatus.

At least one of the objects can be obtained by a telecommunication apparatus or by an autoradar device or by a test equipment apparatus or by a registering instrument or by a satellite apparatus or by an imaging apparatus or any other high frequency equipment comprising the above-mentioned wideband probe fed patch antenna apparatus.

The definition of the word "scaling" means that the physical length of an object (e.g. the height of the integrated backshort) is adjusted (scaled) in order to obtain a desired electrical length in a given dielectric.

BRIEF DESCRIPTION OF THE DRAWINGS

The disclosure of this document will now be described by way of examples with references to the accompanying schematic drawings, of which.

DETAILED DESCRIPTION OF THE INVENTION

Hereinafter, throughout the detailed description of the drawings, examples of the disclosure will be described in detail with reference to the accompanying drawings, wherein for the sake of clarity and understanding some details of no importance may be deleted from the drawings. Some details may have the same reference number but may relate to different examples.

Figure 1A:
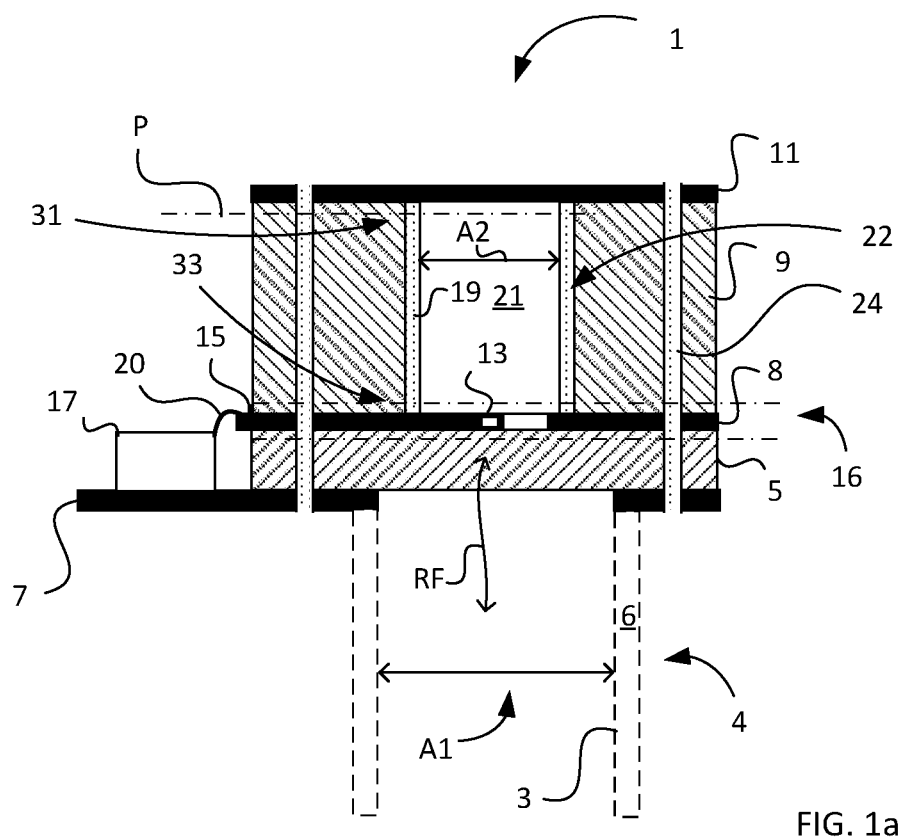
FIGS. 1a and 1b illustrate a waveguide launch system according to a first example.

FIG. 1a illustrates a waveguide launch system 1 according to a first example. The waveguide launch system 1 is configured for translating radio frequency (RF) signal waves. The waveguide launch system 1 comprises a separate waveguide channel 3 of a separate waveguide element 4 having a first cross-section area A1 (also shown in FIG. 1b) defined by separate waveguide channel wall 6. The waveguide launch system 1 further comprises a first printed circuit board lamina 5 comprising an electrically conductive ground member 7 and configured for attachment of the separate waveguide element 4 thereto. A second printed circuit board lamina 9 comprising an electrically conductive backshort cover 11 configured to reflect the radio frequency (RF) signal waves is bonded to the first printed circuit board lamina 5. An electrically conductive barrier arrangement 19 extends perpendicular to a plane P of the first and second printed circuit board lamina 5, 9. The electrically conductive barrier arrangement 19 extends through the second printed circuit board lamina 9.

Figure 1B:
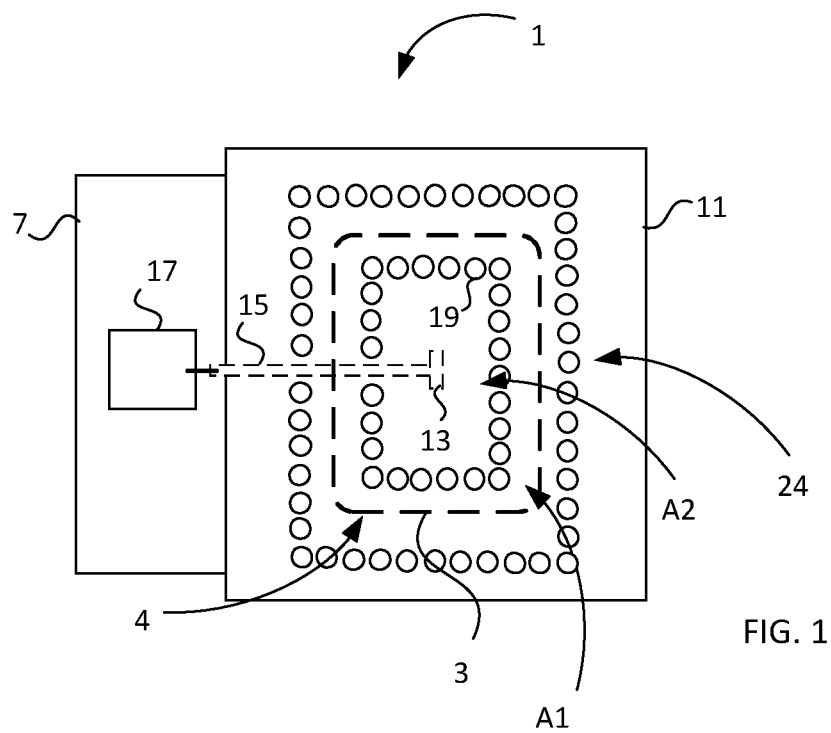

The electrically conductive barrier arrangement 19 and the electrically conductive backshort cover 11 form an integrated electrically conductive backshort volume 21 of an integrated backshort 22 having a second cross-section area A2 (also see FIG. 1b). The second cross-section area A2 is smaller than the first cross-section area A1. The second cross-section area A2 is down-scaled versus the first cross-section area A1 when taking into account a material property of the second printed circuit board lamina 9, the material property being permittivity of the PCB material of the second printed circuit board lamina 9.

The thickness of the second printed circuit board lamina suitably forms the height of the integrated backshort 22.

The thickness of the second printed circuit board lamina 9 is determined by a material property of the second printed circuit board lamina 9, the material property being permittivity of the PCB material of the second printed circuit board lamina 9 and by the extension of the wavelength of the radio frequency (RF) signal waves.

In this example, the thickness of the second printed circuit board lamina 9 may correspond with the length of approximately a quarter of a wavelength of the radio frequency (RF) signal waves.

A probe member 13 is arranged within an interface 16 defined as a bond section between the first printed circuit board lamina 5 and the second printed circuit board lamina 9.

An electrical transmission line signal member 15 is arranged within the interface 16 and is coupled between the probe member 13 and an integrated circuit unit 17.

An outer electrically conductive barrier arrangement 24 surrounds the electrically conductive barrier arrangement 19 and extends perpendicular to the plane P and through the first and second printed circuit board lamina 5, 9. The outer electrically conductive barrier arrangement 24 is electrically coupled between the electrically conductive ground member 7 and the electrically conductive backshort cover 11 for electrical communication. Furthermore, the outer electrically conductive barrier arrangement 24 may be electrically coupled to an electrically conductive ground member plane 8 of the interface 16.

The electrically conductive barrier arrangement 19 is electrically coupled between the electrically conductive backshort cover 11 and the electrically conductive ground member plane 7 via the electrically conductive ground member plane 8 and the outer electrically conductive barrier arrangement 24.

The electrically conductive barrier arrangement 19 may be electrically grounded by coupling a first end 31 of the electrically conductive barrier arrangement 19 to the electrically conductive backshort cover 11, which in turn is coupled to the electrically conductive ground member 7 via the outer electrically conductive barrier arrangement 24. The electrically conductive barrier arrangement 19 may further be electrically grounded by coupling a second end 33 of the electrically conductive barrier arrangement 19 to the electrically conductive ground member plane 8, which in turn is coupled to the electrically conductive ground member 7 via the outer electrically conductive barrier arrangement 24.

The thickness of the integrated circuit unit 17 corresponds with the thickness of the first printed circuit board lamina 5 whereby it is possibly to arrange and couple an optimal short conductive wire 20 between the integrated circuit unit 17 and the electrical transmission line signal member 15.

The thickness of the second printed circuit board lamina 9 is preferably determined by a material property of the second printed circuit board lamina 9, the material property being permittivity of the PCB material of the second printed circuit board lamina 9 and by the scaling of the thickness when taking into account the wavelength of the radio frequency RF signal waves.

Even though the integrated electrically conductive backshort volume 21 is illustrated with no fill (white) in the drawing, it shall be interpreted as comprising the material of the second printed circuit board lamina 9.

FIG. 1b illustrates the waveguide launch system 1 in FIG. 1a shown in a view from above. It is clearly shown that the second cross-section area A2 formed by the electrically conductive barrier arrangement 19 is smaller than the first cross-section area A1 of the separate waveguide element 4.

The second cross-section area A2 is down-scaled versus the first cross-section area A1 when taking into account a material property of the second printed circuit board lamina 9 (FIG. 1), the material property being permittivity of the PCB material of the second circuit board lamina 9. In this example, the perimeter of the first cross-section area A1 is rectangular shaped.

Figure 2A:
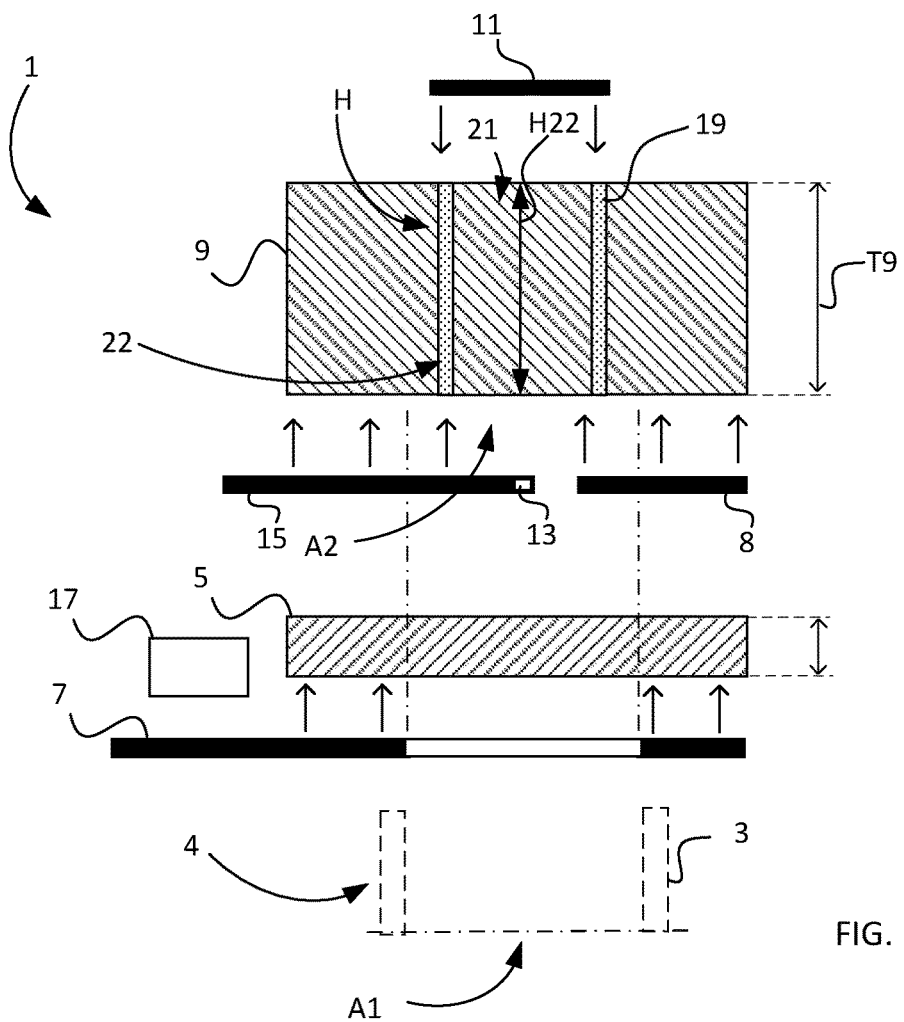
FIGS. 2a and 2b illustrate a waveguide launch system according to a second example.
Figure 2B:
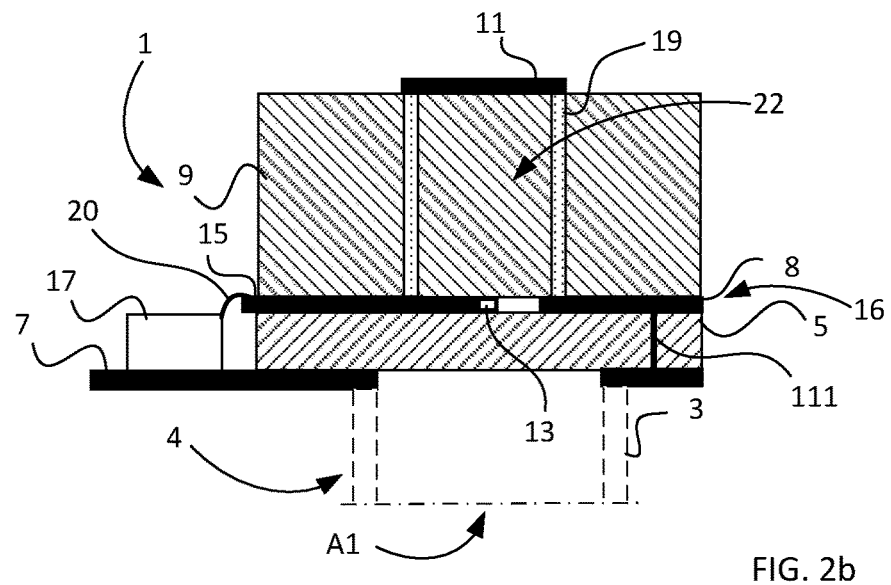

FIGS. 2a and 2b illustrate a waveguide launch system 1 according to a second example. FIG. 2a shows the waveguide launch system 1 and parts before assembly.

According to this example, the waveguide launch system 1 comprises a first printed circuit board lamina 5 and a second printed circuit board lamina 9 having one electrically conductive barrier arrangement 19 comprising a plurality of through holes H filled with electrically conductive material.

The electrically conductive barrier arrangement 19 may is formed by drilling the through holes H through the second printed circuit board lamina 9, and in which through holes H are filled with the electrically conductive material.

The drilling and the filling of the through holes H may be performed before the application of an electrically conductive backshort cover 11 on the upper side of the second printed circuit board lamina 9.

The electrically conductive backshort cover 11 is configured to reflect the radio frequency RF signal waves.

A probe member 13 coupled to an electrical transmission line signal member 15 is configured to be attached to the lower side of the second printed circuit board lamina 9.

An electrically conductive ground member plane 8 is configured to be attached to the lower side of the second printed circuit board lamina 9.

The drilling and the filling of the through holes H may alternatively be performed after the application of the electrically conductive backshort cover 11 on the upper side of the second printed circuit board lamina 9, wherein the through holes H are drilled through the electrically conductive backshort cover 11 and also filled with the electrically conductive material (not shown).

The drilling and the filling of the through holes H may be performed after the application of electrically conductive ground member plane 8 on the lower side of the second printed circuit board lamina 9, wherein the through holes H extend through the electrically conductive ground member plane 8 and also filled with the electrically conductive material (not shown).

The electrically conductive barrier arrangement 19 and the electrically conductive backshort cover 11 being configured to form an integrated electrically conductive backshort volume 21 of an integrated backshort 22 having a second cross-section area A2.

A separate waveguide channel 3 of a separate waveguide element 4 exhibits a first cross-section area A1. The second cross-section area A2 is smaller than the first cross-section area A1.

The first printed circuit board lamina 5 is configured for assembly with an electrically conductive ground member 7, which is configured for attachment to the separate waveguide element 4.

The electrically conductive ground member 7 may be electrically coupled to the electrically conductive ground member plane 8 via a ground connection wire 111 as shown in FIG. 2b.

An integrated circuit unit 17 is prepared to be attached to the first printed circuit board lamina 5 and/or the electrically conductive ground member 7.

The thickness T9 of the second printed circuit board lamina 9 is preferably determined by a material property of the second printed circuit board lamina 9, the material property being permittivity of the PCB material of the second circuit board lamina 9 and by the scaling of the thickness when taking into account the wavelength of the radio frequency RF signal waves.

The thickness T9 of the second printed circuit board lamina 9 suitably forms the height H22 of the integrated backshort 22.

FIG. 2b shows the waveguide launch system 1 and parts after the assembly of the parts. The waveguide launch system 1 is configured for translating radio frequency signal waves. The waveguide launch system 1 comprises a separate waveguide channel 3 of a separate waveguide element 4 having a first cross-section area A1. A first printed circuit board lamina 5 comprising an electrically conductive ground member 7 is configured for attachment of the separate waveguide element 4 thereto.

A suitable adhesive system may be used for adhesion of the electrically conductive ground member 7 to the lower side of the first printed circuit board lamina 5.

A suitable adhesive system may be used for adhesion of the separate waveguide element 4 to the upper lower side of the first printed circuit board lamina 5.

An integrated circuit unit 17 is adhered to the first printed circuit board lamina 5 and/or the electrically conductive ground plane member 7. The thickness of the integrated circuit unit 17 may correspond with the thickness of the first printed circuit board lamina 5.

An electrically conductive backshort cover 11 is adhered to an upper side of a second printed circuit board lamina 9. An electrically conductive ground member plane 8 and an electrical transmission line signal member 15 coupled to a probe member 13 may be adhered to a lower side of the second printed circuit board lamina 9.

The second printed circuit board lamina 9 may be semi-cured before the assembly to the first printed circuit board lamina 5.

The first printed circuit board lamina 5 may be less partly cured than the semi-cured second printed circuit board lamina 9 before assembly.

The first printed circuit board lamina 5 and the second printed circuit board lamina 9 being co-cured in a co-curing process.

After assembly/co-curing of the first printed circuit board lamina 5 to the second printed circuit board lamina 9, the electrical transmission line signal member 15 coupled to the probe member 13 and the electrically conductive ground member plane 8 will be positioned within an interface 16 defined as a bond section between the first printed circuit board lamina 5 and the second printed circuit board lamina 9.

The thickness of the second printed circuit board lamina 9 forms the height of the integrated backshort 22.

The thickness of the second printed circuit board lamina 9 is preferably determined by a material property of the second printed circuit board lamina 9, the material property being permittivity of the PCB material of the second printed circuit board lamina 9 and by the scaling of the thickness when taking into account the wavelength of the radio frequency RF signal waves.

The electrical transmission line signal member 15 will thus have a distance (height) from the electrically conductive ground member 7 that corresponds with the thickness of the integrated circuit unit 17, since the thickness of the integrated circuit unit 17 corresponds with the thickness of the first printed circuit board lamina 5.

A short conductive wire 20 is coupled between the integrated circuit unit 17 and the electrical transmission line signal member 15. In such way, deterioration of the RF performance of the conductive wire transition is avoided.

The second cross-section area A2 (FIG. 2a) is down-scaled versus the first cross-section area A1 when taking into account a material property of the second printed circuit board lamina 9, the material property being permittivity of the PCB material of the second printed circuit board lamina 9.

The radio frequency RF signal waves are transmitted through the material of the second printed circuit board lamina 9 within the integrated electrically conductive backshort volume 21, and for achieving optimal performance of the system 1, the second cross-section area A2 of the integrated backshort 22 is to be down-scaled relative the first cross-section area A1.

The applicant has made great effort in determining that the second cross-section area A2 of the integrated backshort 22 has to be down-scaled, at the same time as a less bulky waveguide launch is achieved. It has surprisingly been shown that optimal RF transmission performance is achieved by such technical feature.

Figure 3A:
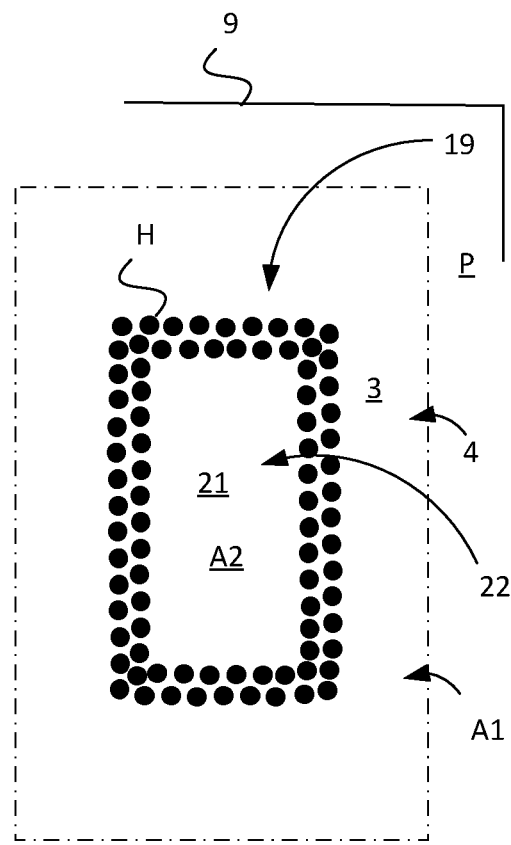
FIGS. 3a and 3b illustrate examples of electrically conductive barrier arrangements.
Figure 3B:
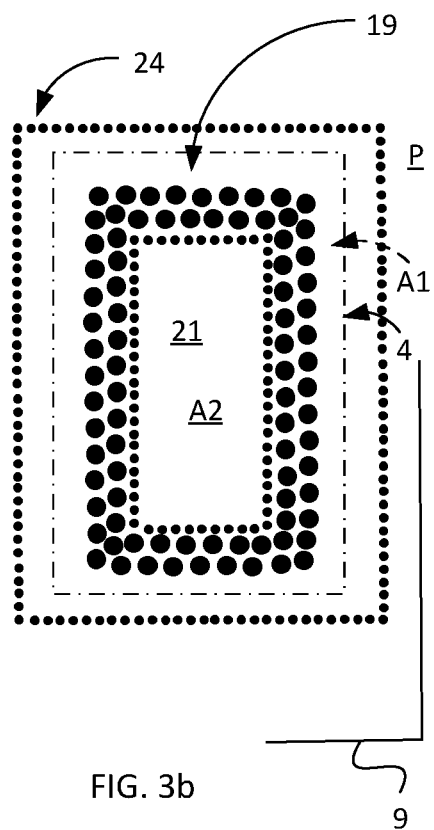

FIGS. 3a and 3b illustrate examples of electrically conductive barrier arrangements of exemplary waveguide launch systems. A separate waveguide channel 3 (FIG. 3a) of a separate waveguide element 4 having a first cross-section area A1 (FIG. 3b) is part of the waveguide launch system 1 (FIGS. 1a and 1b). FIG. 3a illustrates an electrically conductive barrier arrangement 19 extending perpendicular to the plane P of the second printed circuit board lamina 9. The electrically conductive barrier arrangement 19 extends through the second printed circuit board lamina 9, wherein the electrically conductive barrier arrangement 19 and the electrically conductive backshort cover (not shown) form an integrated electrically conductive backshort volume 21 of an integrated backshort 22 having a second cross-section area A2, which is smaller than the first cross-section area A1 of the separate waveguide element 4. The electrically conductive barrier arrangement 19 comprises a plurality of through holes H in at least double rows and machined through the second printed circuit board lamina 9, and in which through holes H are filled with electrically conductive material.

FIG. 3b illustrates an electrically conductive barrier arrangement 19 extending perpendicular to the plane P of the second printed circuit board lamina 9. An outer electrically conductive barrier arrangement 24 surrounds the electrically conductive barrier arrangement 19 and extends perpendicular to the plane P of the second printed circuit board lamina 9 and through a first printed circuit board lamina 5 as shown in FIG. 1a (being concealed by the second printed circuit board lamina 9 and thus is not seen in FIG. 3b) and the second printed circuit board lamina 9 (FIG. 1a). In this way, a waveguide launch system that is robust is achieved, wherein the outer electrically conductive barrier arrangement 24 provides that the waveguide launch will have additional structural strength and robustness.

The thickness of the second printed circuit board lamina 9 is preferably determined by a material property of the second printed circuit board lamina 9, the material property being permittivity of the PCB material of the second printed circuit board lamina 9 and by the scaling of the thickness when taking into account the wavelength of the radio frequency RF signal waves.

In such a way, the waveguide launch system that can be manufactured by low-cost PCB (Printed Circuit Board) technology and produced cost-effectively is achieved.

The waveguide launch system eliminates the need of labour-intensive manufacture of external mechanical back shorts, while maintaining wideband RF performance.

In some examples, a waveguide launch system that is compatible with thin RF circuits and at the same time hermeticity is provided by means of the integrated backshort being integrated in the second printed circuit board lamina.

The waveguide launch system is suitable for mm-wave frequencies and at the same time as it the waveguide launch system is compatible with standard low cost PCB technologies.

Accordingly, a waveguide launch system that can be manufactured cost-effectively and be of extremely small dimension for generating mm-wave frequencies in a robust way is achieved.

Figure 4:
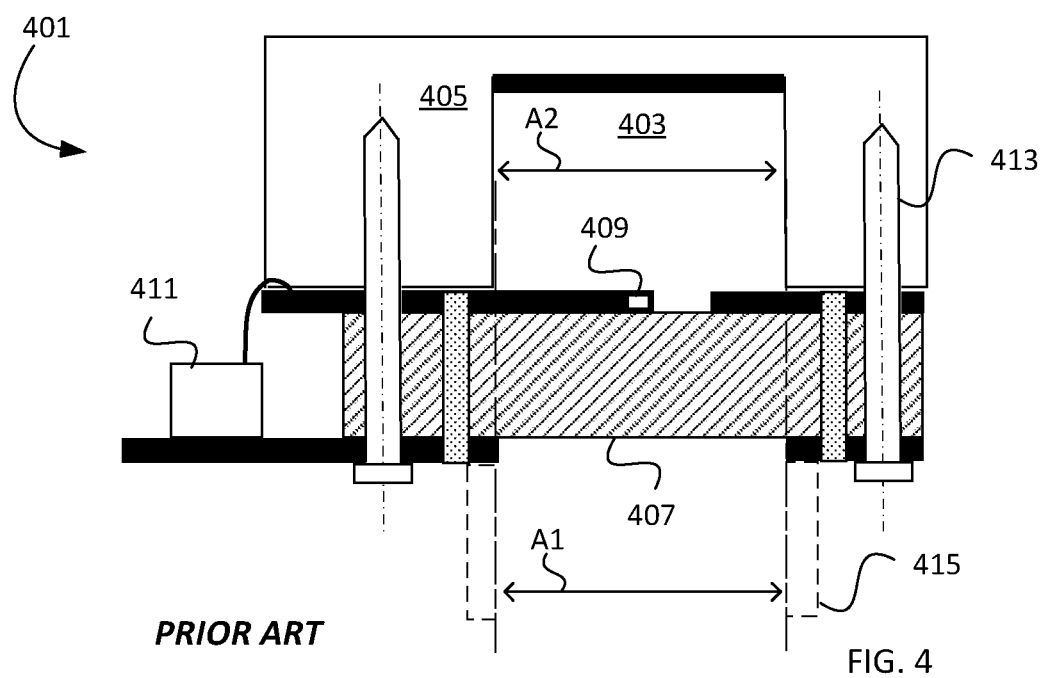
FIG. 4 illustrates a mechanical backshort according to prior art.

FIG. 4 illustrates a mechanical backshort 401 according to the prior art. A backshort open space 403 is machined in a first metal block 405. A second block 407 comprises a probe member 409 connected to an integrated circuit unit 411. The first block 405 and the second block 407 are assembled to constitute one piece. It is extremely important that the first block 405 and the second block 407 are in proper alignment against each other. Screws 413 are used to tighten the first block 405 and the second block 407 to each other. A separate waveguide element 415 having a first cross-section area A1 is attached to the second block 407. A second cross-section area A2 of the backshort open space 403 corresponds with the area of the first cross-section area A1.

The present invention is not in any way restricted to the examples described above, but may include many possibilities for modifications, or combinations of the described examples, thereof should be apparent to a person with ordinary skill in the art without departing from the basic idea of the invention as defined in the appended claims.

The material of the first and/or second printed circuit board lamina may be based on PTFE (Polytetrafluoroethylene), LCP (liquid-crystal polymer), or other suitable material. In such a way, deterioration of the RF performance is avoided.

The electrically conductive ground member and/or the electrically conductive backshort cover and/or the electrically conductive barrier arrangement and/or the electrical transmission line signal member and/or the electrically conductive ground member plane and/or the outer electrically conductive barrier arrangement may comprise copper.

The definition of the word sealing"scaling" means that the physical length of an object (e.g. the height of the integrated backshort) is adjusted (scaled) in order to obtain a desired electrical length in a given dielectric.

The invention claimed is:

1. A waveguide launch system configured for translating radio frequency signal waves, the waveguide launch system comprising:
   a separate waveguide channel of a separate waveguide element having a first cross-section area;
   a first printed circuit board lamina comprising an electrically conductive ground member and configured for attachment of the separate waveguide element thereto;
   a second printed circuit board lamina comprising an electrically conductive backshort cover configured to reflect the radio frequency signal waves;
   a probe member arranged within an interface defined between the first printed circuit board lamina and the second printed circuit board lamina;
   an electrical transmission line signal member arranged within said interface and coupled between the probe member and an integrated circuit unit; wherein
   a thickness of the second printed circuit board lamina is determined by a material property of the second printed circuit board lamina being permittivity of a PCB material used and by scaling of said thickness when taking into account the wavelength of the radio frequency signal waves, wherein a thickness of the integrated circuit unit corresponds with a thickness of the first printed circuit board lamina; the waveguide launch system further comprises:

an electrically conductive barrier arrangement extending perpendicular to a plane of the second printed circuit board lamina and extending through the second printed circuit board lamina, wherein the electrically conductive barrier arrangement and the electrically conductive backshort cover form an integrated electrically conductive backshort volume of an integrated backshort having a second cross-section area, which is smaller than the first cross-section area, wherein an outer electrically conductive barrier arrangement is configured to at least partially surround the electrically conductive barrier arrangement and the outer electrically conductive barrier arrangement extends perpendicular to the plane and through the first and second printed circuit board lamina.

2. The waveguide launch system according to claim 1, wherein the second cross-section area is down-scaled versus the first cross-section area when taking into account the material property of the second printed circuit board lamina being permittivity of a PCB material used.

3. The waveguide launch system according to claim 1, wherein the thickness of the second printed circuit board lamina corresponds with a length of approximately a quarter of a wavelength of the radio frequency signal waves.

4. The waveguide launch system according to claim 1, wherein the thickness of the second printed circuit board lamina corresponds to a height of the integrated backshort.

5. The waveguide launch system according to claim 1, wherein the electrically conductive barrier arrangement comprises through holes machined through the second printed circuit board lamina and in which the through holes are filled with electrically conductive material.

6. The waveguide launch system according to claim 1, wherein an electrically conductive wire is coupled between the integrated circuit unit and the electrical transmission line signal member of the first printed circuit board lamina.

7. The waveguide launch system according to claim 1, wherein the outer electrically conductive barrier arrangement is electrically coupled between the electrically conductive ground member and the electrically conductive backshort cover for electrical communication.

8. The waveguide launch system according to claim 7, wherein the outer electrically conductive barrier arrangement is further electrically coupled to an electrically conductive ground member plane located at the interface.

9. The waveguide launch system according to claim 1, wherein the first cross-section area has a perimeter that is rectangular in shape.

\* \* \* \* \*